(12) United States Patent
Brown

(10) Patent No.: US 7,907,019 B1
(45) Date of Patent: Mar. 15, 2011

(54) METHOD AND SYSTEM FOR OPERATING A MEMS SCANNER ON A RESONANT MODE FREQUENCY

(75) Inventor: James Steven Brown, Alviso, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 255 days.

(21) Appl. No.: 12/286,615

(22) Filed: Oct. 1, 2008

(51) Int. Cl.
*H03L 7/06* (2006.01)
*H03L 7/08* (2006.01)
*H03L 7/085* (2006.01)
*H03L 7/099* (2006.01)

(52) U.S. Cl. ............... 331/18; 331/1 A; 331/17; 331/25; 331/154; 331/155

(58) Field of Classification Search .................. 331/1 A, 331/17, 18, 25, 154–159
See application file for complete search history.

(56) References Cited

U.S. PATENT DOCUMENTS

| 6,856,712 B2 * | 2/2005 | Fauver et al. ................... 385/12 |
| 6,995,622 B2 | 2/2006 | Partridge et al. |
| 2005/0179976 A1 * | 8/2005 | Davis et al. ................... 359/224 |
| 2007/0273794 A1 * | 11/2007 | Sprague et al. ............... 348/744 |

OTHER PUBLICATIONS

Chuanwei Wang, et al., "Implementation of phase-locked loop control for MEMS scanning mirror using DSP", ScienceDirect, Sensor and Actuators A 133, 2007, p. 243-249.
Randy Sprague, et al., "Bi-axial magnetic drive for Scanned Beam Display mirrors", Proc. of SPIE, vol. 5721, 2005, p. 1-13.
Pablo Gomez, "State-of-the-art of MEMS Technology for Design and Fabrication of Micro-Mirrors", Florida International University, Advanced Electronics Systems I, Spring 2003, 12 pages.
Shorya Awtar, et al., "Two-Axis Optical MEMS Scanner", 4 pages; 2005; Proc . ASPE 2005 Annual Meeting; paper No. 1800.

* cited by examiner

*Primary Examiner* — David Mis

(57) ABSTRACT

A method for operating a micro-electro-mechanical system (MEMS) scanner on a resonant mode frequency is provided. The method includes generating a drive signal for a MEMS scanner. A sensor signal is received from the MEMS scanner. The drive signal is compared to the sensor signal. An accumulated correction signal is generated based on the comparison of the drive signal and the sensor signal. The drive signal for the MEMS scanner is then adjusted based on the accumulated correction signal.

23 Claims, 12 Drawing Sheets

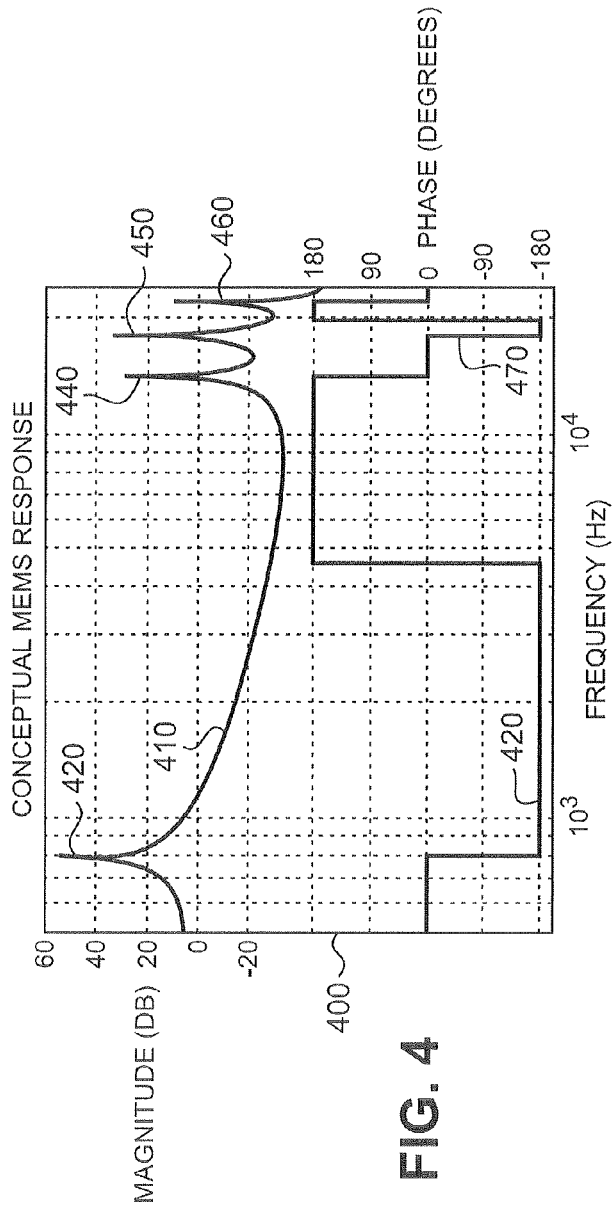
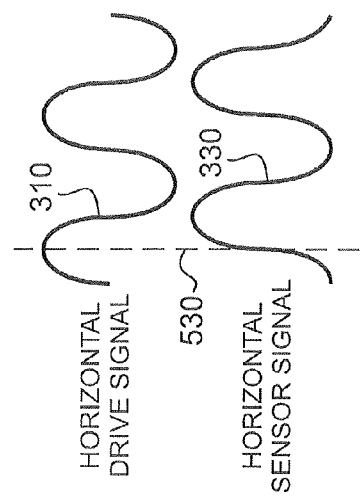
FIG. 4
FIG. 5

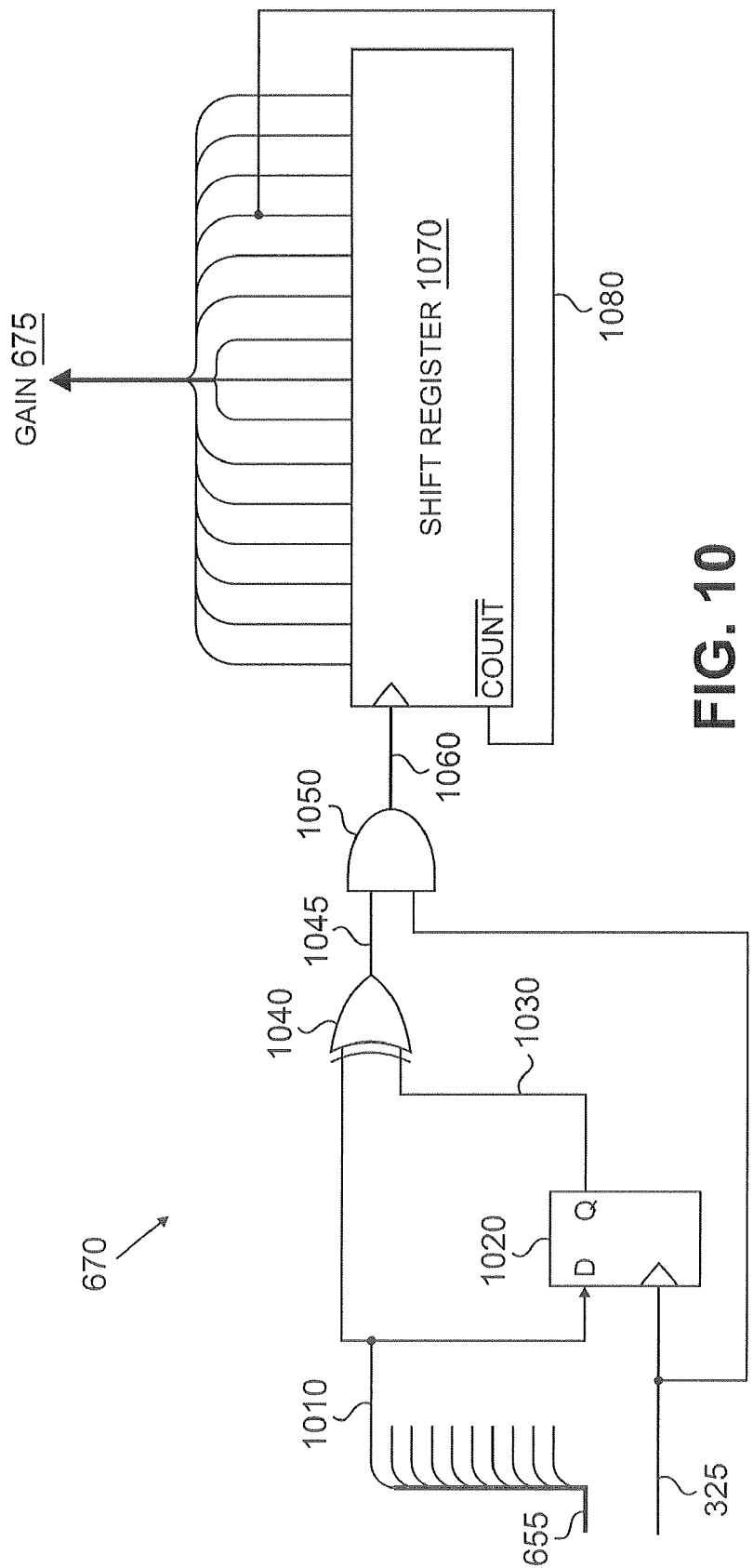

//www.w3.org/1999/xhtml">
METHOD AND SYSTEM FOR OPERATING A MEMS SCANNER ON A RESONANT MODE FREQUENCY

CROSS-REFERENCE TO RELATED APPLICATIONS

The present application is related to U.S. patent application Ser. No. 12/286,605 titled "METHOD AND SYSTEM FOR GENERATING A DRIVE SIGNAL FOR A MEMS SCANNER," filed concurrently herewith. This patent application is assigned to the assignee of the present application. The subject matter disclosed in this patent application is hereby incorporated by reference into the present disclosure as if fully set forth herein.

TECHNICAL FIELD

This disclosure is generally related to MEMS technology and, more specifically, to a method and system for operating a MEMS scanner on a resonant mode frequency.

BACKGROUND

Laser-based and LED-based video projectors have been used extensively in business environments and have recently come into wide use in large-screen projection systems in home theaters. The miniaturization of projection systems has led to the development of "pico-projectors" that may be embedded in other systems, such as mobile phones and heads-up displays for vehicle dashboards, or may be implemented as stand-alone devices, such as pocket or ultra-mobile projectors that maybe be powered from a battery or an external power source.

One example of a pico-projector system is the PicoP™ projector engine developed by Microvision, Inc. The PicoP engine includes RGB laser sources, a micro-electro-mechanical system (MEMS) scanning mirror, optics and video processing electronics for receiving video data from a source and generating an image to be projected onto any viewing surface (e.g., a screen, a wall, a sheet of paper or a chair back). However, pico-projection systems such as this that use a MEMS scanning mirror face a number of technical problems that are not as critical in larger projection systems.

A conventional MEMS scanning mirror implemented in a pico-projection system is a two-dimensional scanning mirror that sweeps laser beams across a viewing surface similar to the vertical and horizontal sweep of an electron beam in a CRT-based television or monitor. The horizontal sweep is typically done at one of the resonant mode frequencies of the scanning mirror that is on the order of 18 kHz. Operating on a resonant mode allows maximum beam deflection with minimal input energy. Although the horizontal movement is sinusoidal, the image may be pre-warped by an image processor in order to compensate for the sinusoidal movement. The vertical sweep is generally desired to be an ideal saw tooth to provide a linear sweep movement from top-to-bottom with minimal retrace time, thus maximizing the allowable active video time.

Ideally, the MEMS scanning mirror would have only one resonant mode at the horizontal sweep frequency. However, in reality, the mirror has multiple resonant modes other than the horizontal sweep frequency. This complicates any approach to finding MEMS resonant modes since it is important to operate on the intended mode rather than an adjacent one.

Peak search hardware and algorithms may be employed to find the appropriate resonant mode for operating the MEMS scanning mirror. Typical peak searches require knowing signal magnitude, which requires an analog-to-digital converter (ADC). Since the sensor signal size will be low when operating at a frequency far from the resonant mode, the resolution of the ADC needs to be high enough such that a change in frequency will result in a change of at least one ADC count. Otherwise, no direction information is available. In addition, peak search algorithms do not know inherently which way to move. Therefore, two measurements are required for every move to determine in which direction to move. Finally, peak searches are susceptible to local minima/maxima, which can trap the search at a suboptimum point. Typically, peak search algorithms overcome this difficulty by making some search inquiries far away from the current operating point. However, this complicates the algorithm and forces less than optimal operation for some period of time, which reduces overall effectiveness.

BRIEF DESCRIPTION OF THE DRAWINGS

For a more complete understanding of this disclosure and its features, reference is now made to the following description, taken in conjunction with the accompanying drawings, in which:

FIG. 4 is a graph illustrating a simplified conceptual MEMS response for various resonant modes according to one embodiment of the present disclosure;

FIG. 5 illustrates horizontal drive and horizontal sensor waveforms;

FIG. 10 is a block diagram illustrating the Dither Detect & "Gain" block of FIG. 6 according to one embodiment of the present disclosure;

DETAILED DESCRIPTION

FIGS. 1 through 13, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

Figure 1:
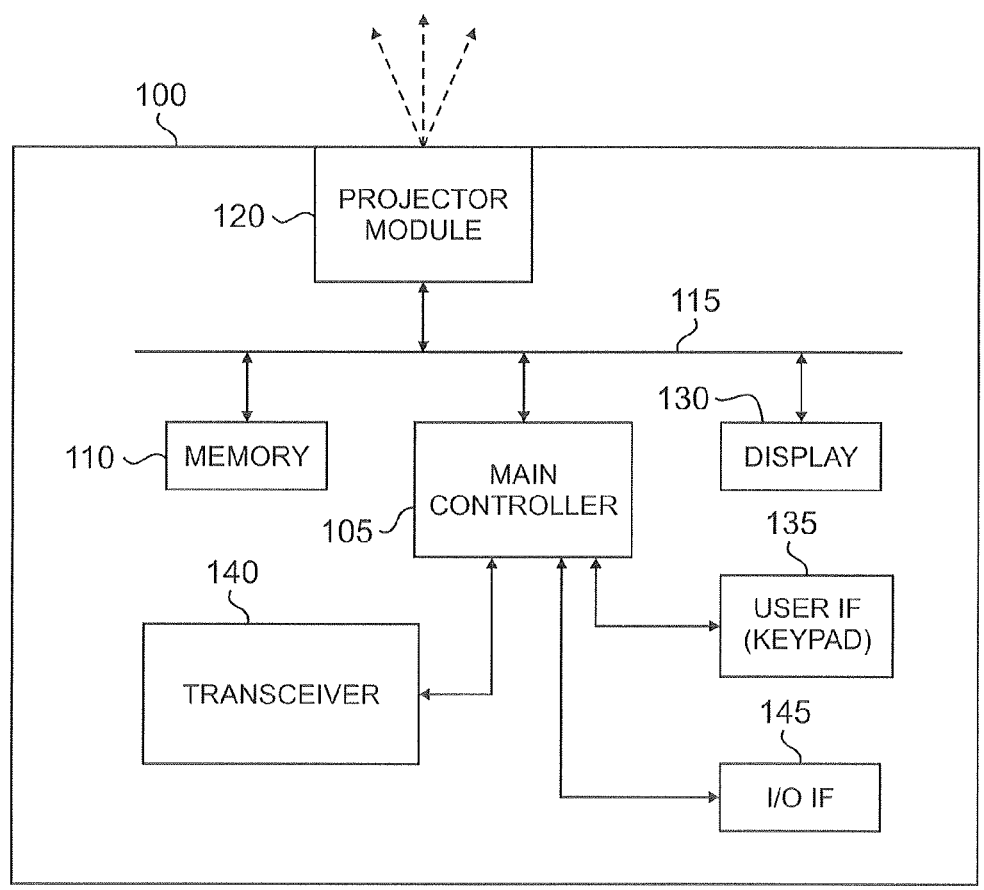
FIG. 1 is a block diagram of a mobile phone that includes a pico-projection system according to one embodiment of the present disclosure.

FIG. 1 is a high-level block diagram of a mobile phone 100, which includes an embedded pico-projection system according to one embodiment of the present disclosure. The mobile phone 100 is simply one particular embodiment of the present invention. Those skilled in the art will readily understand that the miniature projection system described herein may be embedded in other types of portable devices or may be implemented as a stand-alone device.

The illustrated mobile phone 100 comprises a main controller 105, a memory block 110, a communication bus 115, a projector module 120, a display block 130, a user interface (IF) 135, a transceiver 140 and an input-output interface (I/O IF) 145. The main controller 105 is the central processor that supervises the overall operation of the mobile phone 100. The memory block 110 may include one or more conventional read-only memory (ROM) devices and/or random access memory (RAM) devices (including a Flash RAM), as well as an optional removable memory card. The display block 130 may comprise typical LCD color display circuitry that is common to most mobile phones. The communication bus 115 enables the transfer of data between the main controller 105, the memory 110 and the display 130, as well as the projector module 120.

The projector module 120 is a pico-projector device that uses, for example, three laser diodes (red, green and blue) to project an image onto any suitable surface, such as a wall, a screen, a sheet of paper, a desktop, or the like. The main controller 105 controls the projector module 120 in response to user commands that may be received via the user IF 135 or external commands that may be received via the transceiver 140. By way of example, a user may enter commands that cause the main controller 105 to retrieve a slide show presentation file from the memory 110 and to display the slides via the projector module 120 and/or the display block 130.

Figure 2:
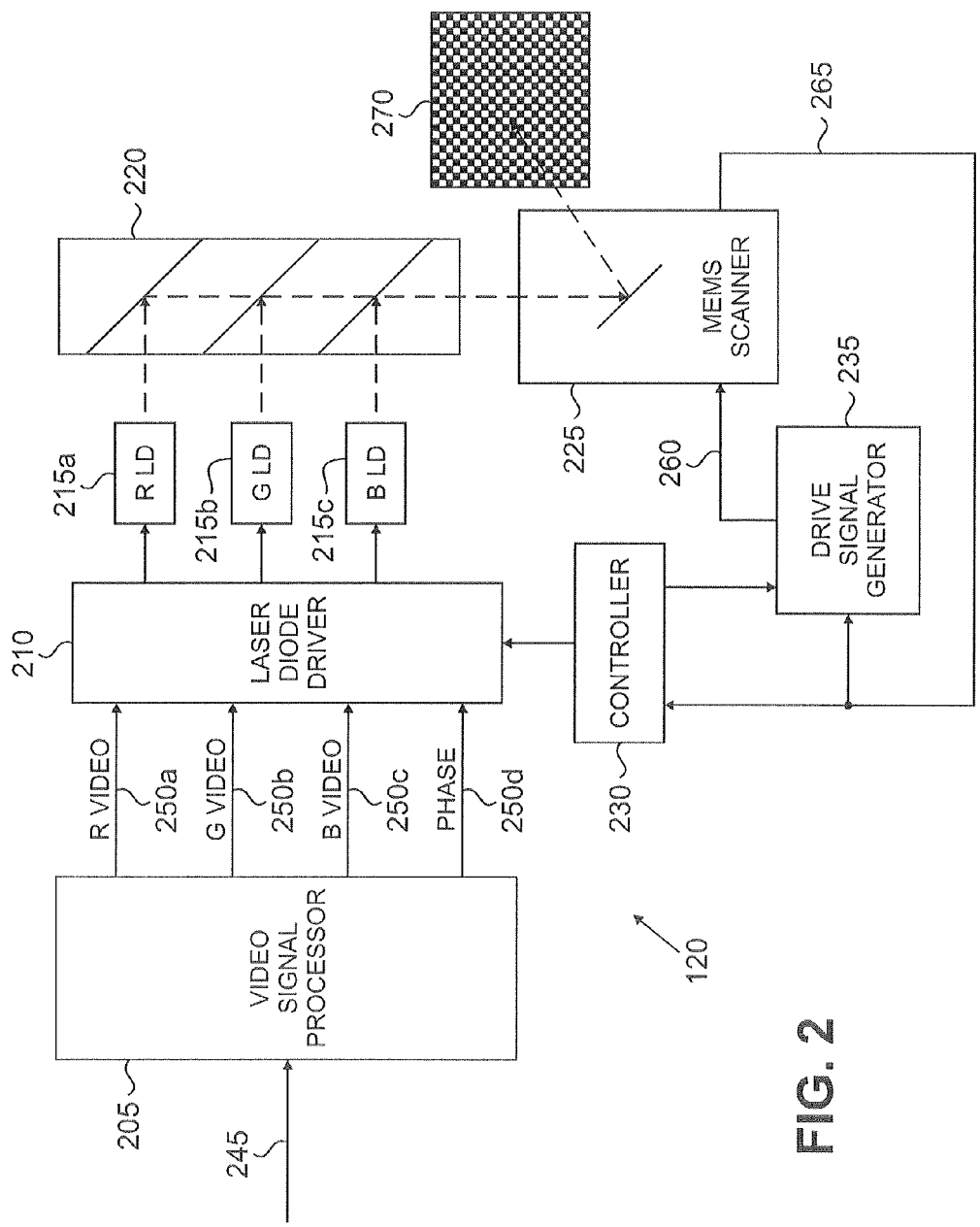
FIG. 2 is a block diagram of selected portions of the projector module of FIG. 1 according to one embodiment of the present disclosure.

FIG. 2 is a block diagram of selected portions of the projector module 120 according to one embodiment of the present disclosure. For the illustrated embodiment, the projector module 120 comprises a video signal processor 205, a laser diode driver 210, a red laser diode (R LD) 215a, a green laser diode (G LD) 215b, a blue laser diode (B LD) 215c, combiner optics 220, an electromagnetic MEMS scanner with integrated sensors 225, a controller 230 and a drive signal generator 235.

The controller 230 generates control signals for the drive signal generator 235 and feeds back scanner position information to the video signal processor 205. The control signals may be generated partly based on a sensor signal 265 received by the controller 230 from the scanner sensor of the MEMS scanner 225, which is capable of sensing position and/or movement information related to the MEMS scanner 225.

The drive signal generator 235 is capable of generating horizontal and vertical drive signals 260 that cause the MEMS scanner 225 to sweep the light beam that is output by the combiner optics 220 across a viewing surface in order to generate a two-dimensional raster image 270.

Figure 3:
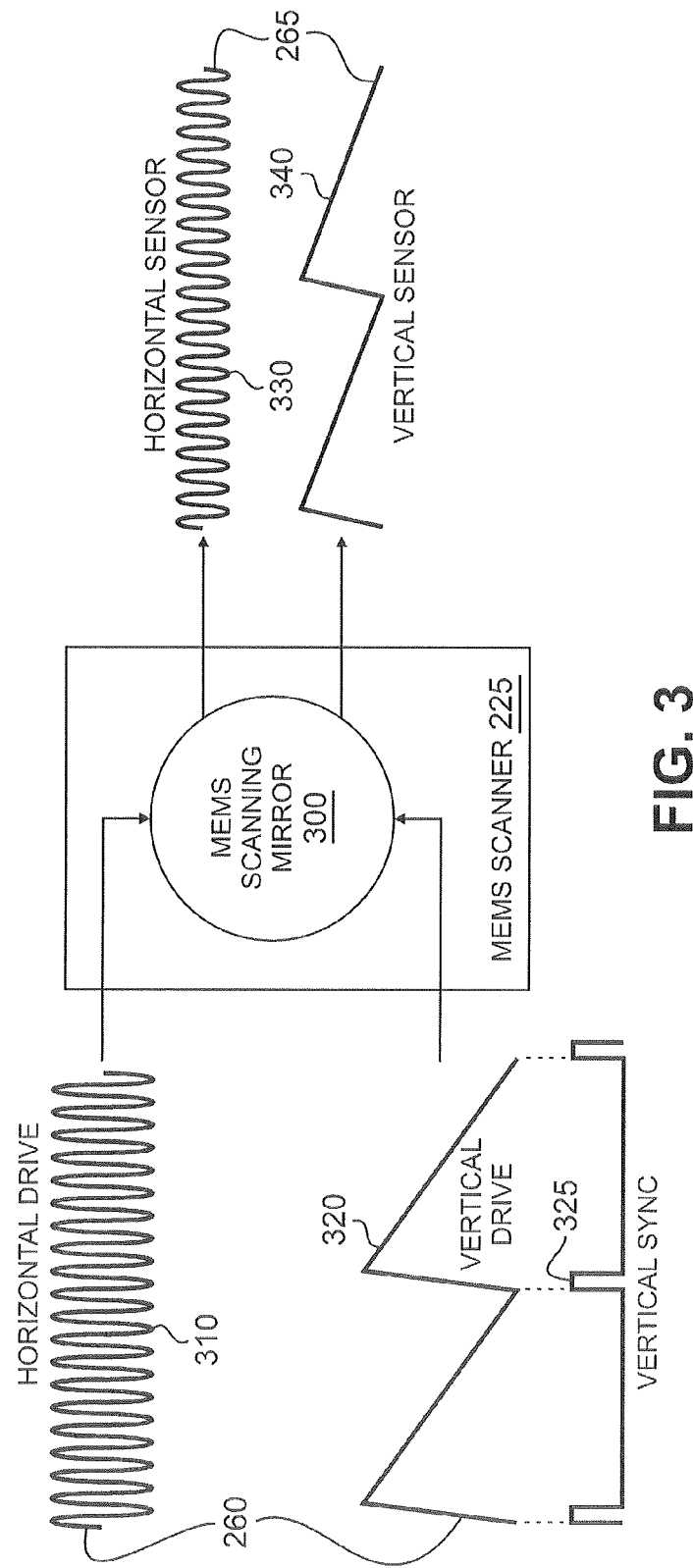
FIG. 3 is a block diagram of a MEMS scanning mirror showing typical drive and sensor waveforms according to one embodiment of the present disclosure.

FIG. 3 is a block diagram of a MEMS scanner 225, including a MEMS scanning mirror 300, showing typical drive and sensor waveforms according to one embodiment of the present disclosure. For the illustrated embodiment, a horizontal drive signal 310 and a vertical drive signal 320 excite the mechanical motion of the MEMS scanner 225. The drive signals 310 and 320 may be applied separately, as shown, or in any other suitable manner. For example, alternative methods may include using a drive signal comprising the composite of the signals 310 and 320 or composite differential of the signals 310 and 320. The signals 310 and 320, in whatever manner chosen, are jointly represented by the drive signal 260 of FIG. 2. Also illustrated in FIG. 3 is a vertical synchronization signal 325, which identifies the beginning of each vertical retrace. The dotted lines show the time relationship between the vertical drive signal 320 and the vertical synchronization signal 325.

In FIG. 3, integral sensors (e.g., transducers) may convert the mechanical motion and/or position of the MEMS scanning mirror 300 into electrical signals for movement and/or position. For the illustrated embodiment, the sensor signals 330 correspond to horizontal axis movement and/or position and the sensor signals 340 correspond to vertical axis movement and/or position. The sensor signals 330 and 340 are jointly represented by the sensor signal 265 of FIG. 2.

FIG. 4 is a graph 400 illustrating a simplified conceptual MEMS drive-to-sensor response for various resonant modes according to one embodiment of the present disclosure. This gain/phase plot 400 illustrates four resonant modes. An actual physical MEMS scanner 225 may have many more resonant modes. The first mode 420 in this example is at 780 Hz, the second mode 440 is at 14 kHz, the third mode 450 is at 18 kHz, and the fourth mode 460 is at 22 kHz. The third mode 450 in this example is at 18 kHz and has response in the horizontal axis. In this example, the third mode 450 is useful for horizontal sweep, while the first mode 420 is an artifact that interferes with vertical sweep, as described in U.S. patent application Ser. No. 12/283,759, titled "SYSTEM FOR SUPPRESSING UNDESIRABLE OSCILLATIONS IN A MEMS SCANNER," filed Sep. 16, 2008. As will be further described, the second and fourth modes 440 and 460 are undesirable artifacts to be avoided. Magnitude levels are illustrative only since various MEMS designs will have different magnitude responses.

Various means within the controller 230 and the drive signal generator 235 may be employed to match the frequency of the horizontal drive signal 310 to the appropriate MEMS resonant mode 450. A more accurate match results in better horizontal drive-to-angular motion efficiency of the scanner 225.

As described in more detail below, the projector module 120 is capable of operating an integrated micro-electromechanical system (MEMS) scanner on a resonant mode frequency using a digital phase-locked loop. In addition, within the digital phase-locked loop, a drive signal 310 may be generated for the MEMS scanner using a direct digital synthesis oscillator.

Thus, for this embodiment, the drive signal generator 235 is capable of finding the correct horizontal resonant mode frequency (to within less than 1 Hz) and driving the MEMS scanner 225 using this frequency. The drive signal generator 235 is also capable of tracking the appropriate resonant mode frequency over temperature and time, while avoiding driving the MEMS scanner 225 on adjacent resonant modes.

FIG. 4 is a graph 400 illustrating the gain phase of the MEMS scanner 225 according to one embodiment of the present disclosure. For the particular example illustrated in FIG. 4, the resonant mode frequency 450 used for the horizontal sweep has a two-pole, high-Q response.

The gain phase of the MEMS scanner 225 is observable in the graph 400 as the drive-to-sensor transfer function. In addition, the phase waveform 420 at 470, illustrates the −180° phase shift over a very small frequency range that is expected in association with the horizontal resonant mode frequency. This includes a 90° phase lag at the exact horizontal resonant mode frequency. Therefore, the drive signal generator 235 may use this phase relationship as the identifying factor to find and track the correct horizontal resonant mode frequency. It will be understood that a phase lag other than 90° may be used for other suitable applications.

The drive signal generator 235 is capable of finding the horizontal resonant mode frequency by locking the phase relationship between the MEMS horizontal drive signal 310 and the horizontal sensor signal 330 at the desired phase difference (e.g., 90°).

FIG. 5 illustrates horizontal drive and horizontal sensor waveforms. The horizontal drive signal 310 is representative of the drive waveform associated with resonant mode 450 of FIG. 4. The horizontal sensor signal 330 is representative of the sensor waveform associated with resonant mode 450 of FIG. 4. When operating at the frequency of resonant mode 450, a 90° phase relationship 530 will exist between these two signals 310 and 330.

Figure 6:
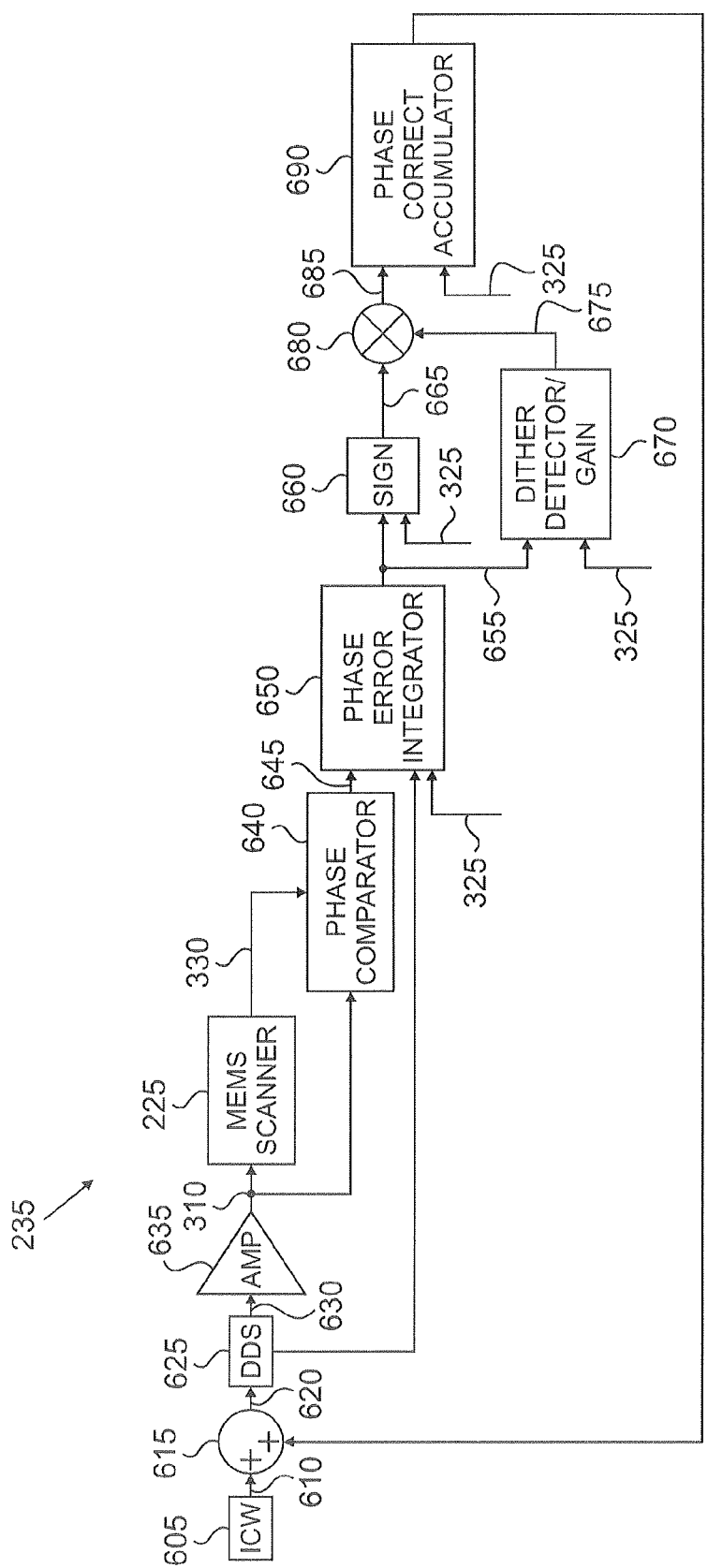
FIG. 6 is a block diagram of the drive signal generator of FIG. 2 according to one embodiment of the present disclosure.

FIG. 6 is a block diagram of the drive signal generator 235 according to one embodiment of the present disclosure. For this embodiment, the drive signal generator 235 comprises ah initial control word (ICW) block 605, an adder 615, a direct digital synthesis (DDS), numerically-controlled oscillator 625, an amplifier 635, a phase comparator 640, a phase error integrator 650, a sign block 660, a dither detector/gain block 670, a multiplier 680 and a phase correct accumulator 690. The MEMS scanner 225 is coupled to the drive signal generator 235 at the amplifier 635 and the phase comparator 640.

The initial control word block 605 is capable of storing or generating a predefined initial control word 610, which the adder 615 is capable of adding to an accumulated correction signal 695 from the phase correct accumulator 690 to generate a summation 620. The initial control word 610 may be set to the nominal horizontal resonant frequency of the MEMS scanner 225. The direct digital synthesis oscillator 625 is capable of receiving the summation 620 and generating a drive signal 630 for the amplifier 635, which is capable of amplifying the drive signal 630 to generate the horizontal drive signal 310 for the MEMS scanner 225. For one embodiment, the amplifier 635 may be capable of receiving the horizontal sensor signal 265 in a closed loop. In addition, the amplification factor for the amplifier 635 may be set to any suitable predefined value that will yield the correct horizontal sweep size.

The horizontal drive signal 310 is also provided to the phase comparator 640, along with the horizontal sensor signal 330 from the MEMS scanner 225. The phase comparator 640 is capable of comparing the drive phase of the horizontal drive signal 310 to the sensor phase of the horizontal sensor signal 330 to generate a comparator output 645 for the phase error integrator 650.

For one embodiment, when the phase lag between the drive phase and the sensor phase is too low (e.g., less than 90°), the frequency of the horizontal drive signal 310 is too low. In this case, the phase comparator 640 may generate a comparator output 645 of +1. For this embodiment, when the phase lag between the drive phase and the sensor phase is too high (e.g., more than 90°), the frequency of the horizontal drive signal 310 is too high. In this case, the phase comparator 640 may generate a comparator output 645 of −1. Thus, the comparator output 645 provides the phase polarity for each horizontal cycle. It will be understood that the outputs 645 may be reversed (+1 for too high and −1 for too low) without departing from the scope of the present disclosure.

In addition to the phase comparator output 645, the phase error integrator 650 is also capable of receiving a vertical synchronization signal 325 and a horizontal rollover signal 632. The horizontal rollover signal 632, as will be further described, is a single-bit logic signal of the same frequency as the signal 630. For one embodiment, other components (not shown in FIG. 6) of the drive signal generator 235 may be implemented to generate a vertical drive signal 320, and one of these components may be capable of generating the vertical synchronization signal 325 based on the vertical drive signal 320. The vertical synchronization signal 325 is a logic signal corresponding to the vertical drive signal retrace (e.g., from low to high).

Figure 9A:
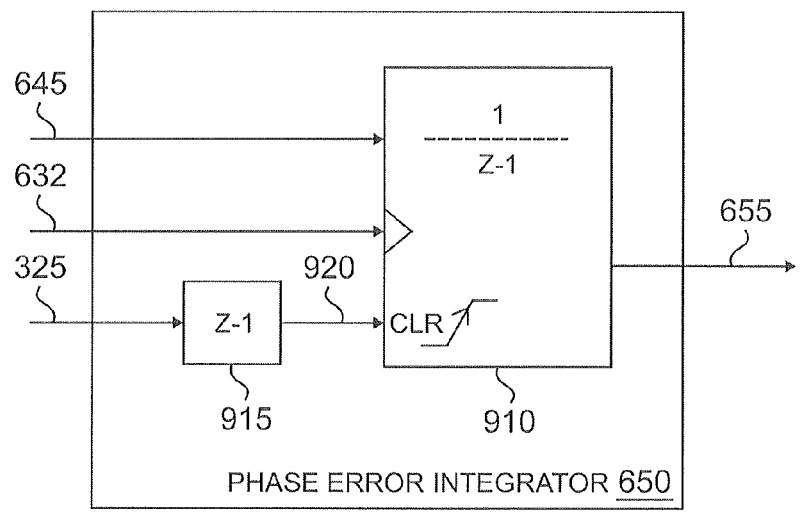
FIG. 9A is a block diagram of the phase error integrator of FIG. 6 according to one embodiment of the present disclosure.

For one embodiment, the phase error integrator 650 is capable of adding the comparator output 645 from the phase comparator 640 to an error signal 655 each time the horizontal rollover signal 632 indicates that a horizontal rollover has occurred. In addition, the phase error integrator 650 is capable of clearing the error signal 655, with a clear signal 920 (as shown in FIG. 9A), which is the vertical synchronization signal 325 delayed by one clock cycle. Therefore, the error signal 655 comprises a sum of the phase errors over one vertical cycle.

Figure 9B:
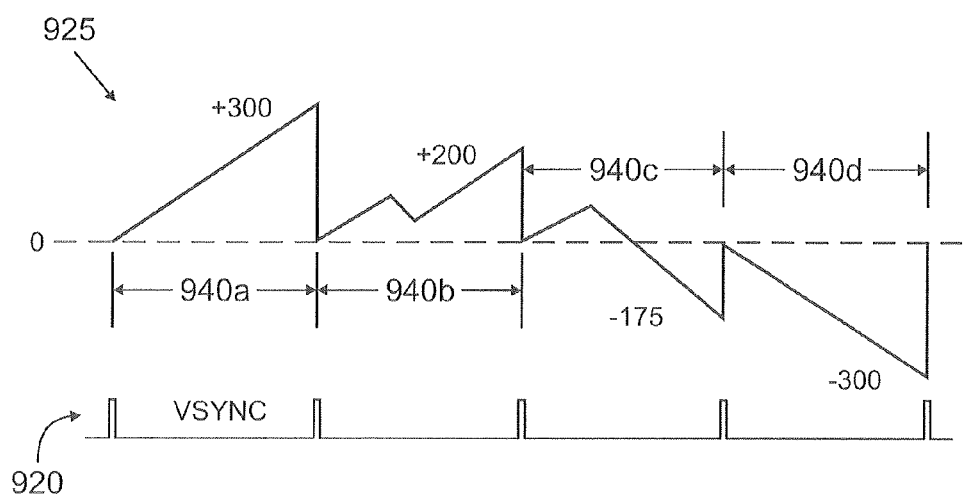
FIG. 9B is a timing diagram for the phase error integrator of FIG. 9A according to one embodiment of the present disclosure.

FIG. 9B represents the error signal 655 and the clear signal 920 of the phase error integrator 650. In the example of FIG. 9B, there are 300 horizontal cycles for each vertical cycle. In a noiseless and static situation, the error signal 655 would be either +N or −N, with nothing in between. However, there is phase noise in signals 645 and 632. Also, since the loop is converging on the correct frequency, it is not static. Thus, the error signal 655 may vary between +N and −N, where N is the number of horizontal cycles for each vertical cycle of the MEMS scanner 225. When the phase is far from the ideal value, the error signal 655 will be either +N or −N. When the phase is closer to the ideal value, the error signal 655 will be somewhere between +N and −N.

The sign block 660 is capable of receiving the error signal 655 and generating a sign 665 of +1 if the value of the error signal 655 is positive and a sign 665 of −1 if the value of the error signal 655 is negative. Only the polarity (±1) is passed from the phase error integrator 650 to the sign block 660. As a result, a strong noise reduction effect is provided because the polarity effectively represents the average phase error over the vertical sweep interval.

The dither detector/gain block 670 is capable of receiving the error signal 655 and the vertical synchronization signal 325 and is capable of generating a gain 675 based on the error signal 655 for each vertical cycle. The dither detector/gain block 670 is capable of detecting when the error signal 655, sampled at the rising edge of the vertical synchronization signal 325, has the opposite polarity as at the previous sample. Thus, detecting that the horizontal drive signal 310 has crossed over the ideal resonant frequency and is moving back in the other direction (i.e., changing from increasing frequency steps to decreasing or vice-versa).

For one embodiment, the gain 675 refers to the size of each step by the phase correct accumulator 690 for a vertical cycle.

The dither detector/gain block 670 may be capable of adjusting the gain 675 to allow for larger steps as the drive signal generator 235 begins to search for the correct horizontal resonant mode frequency and successively smaller steps as the correct frequency is approached. The multiplier 680 is capable of applying the sign 665 from the sign block 660 to the gain 675 from the dither detector/gain block 670 to generate a signed gain 685.

The phase correct accumulator 690 is capable of receiving the signed gain 685 and the vertical synchronization signal 325 and generating an accumulated correction signal 695 based on the signed gain 685 for each vertical cycle. To do this, the phase correct accumulator 690 is capable of accumulating corrections provided through the signed gain 685 in order to bring the horizontal drive signal 310 to the correct frequency of the desired MEMS resonant mode. For one embodiment, the phase correct accumulator 690 is not cleared and updates the accumulated correction signal 695 when the vertical synchronization signal 325 indicates that the vertical drive signal 320 is beginning a retrace.

As described above, the accumulated correction signal 695 is provided to the adder 615 to be used, along with the initial control word 610, in generating the summation 620. In this way, the direct digital synthesis oscillator 625 may be adjusted until the desired phase relationship between the horizontal drive signal 310 and the horizontal sensor signal 330 is achieved (e.g., a 90° phase lag), allowing the MEMS scanner 225 to be operated at the ideal horizontal resonant frequency. For one embodiment, the drive signal generator 235 may drive the MEMS scanner 225 at an acceptable near resonant frequency as long as the phase relationship between the horizontal drive signal 310 and the horizontal sensor signal 330 is locked to within approximately ±10° of the desired phase lag.

Figure 7A:
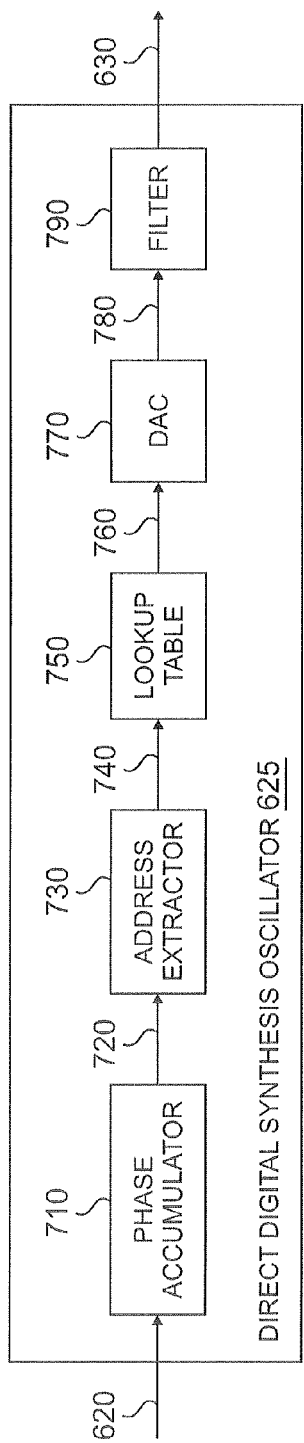
FIG. 7A is a block diagram of the direct digital synthesis oscillator of FIG. 6 according to one embodiment of the present disclosure.

FIG. 7A is a block diagram of the direct digital synthesis oscillator 625 according to one embodiment of the present disclosure. For this simplified embodiment, the direct digital synthesis oscillator 625 comprises a phase accumulator 710, an address extractor 730, a lookup table 750, a digital-to-analog converter (DAC) 770 and a filter 790.

The phase accumulator 710 is capable of receiving the summation 620 of the initial control word 610 and the accumulated correction signal 695 and generating a phase accumulator output 720 based on the summation 620. For one embodiment, the phase accumulator 710 is capable of increasing the phase accumulator output 720 by the value of the summation 620 with each clock cycle. The frequency of operation of the direct digital synthesis oscillator 625 is based on the frequency of rollover for the phase accumulator 710, as shown below:

$$F_o = \frac{CW \times SF}{2^{PA}},$$

where $F_O$ is the frequency of operation, CW is the control word (i.e., the summation 620 in the illustrated embodiment), SF is the sample frequency, and PA is the number of phase accumulator bits. The frequency resolution of the oscillator 625 in Hz is as follows:

$$F_s = \frac{SF}{2^{PA}},$$

For some embodiments, the oscillator 625 may have a frequency resolution less than 10 mHz.

The address extractor 730 is capable of extracting an address 740 for the lookup table 750 based on the phase accumulator output 720. For one embodiment, the address extractor 730 is capable of extracting a specified number of the upper bits of the phase accumulator output 720. For example, for a particular embodiment, the address extractor 730 may extract the upper six bits of the phase accumulator output 720.

The extracted address 740 is used to address the lookup table 750 and generate a lookup table output 760. For one embodiment, the lookup table 750 may be loaded with a sine wave of size 64×6; however, it will be understood that the lookup table 750 may be loaded with other suitable contents without departing from the scope of this disclosure. The digital-to-analog converter 770 is capable of converting the lookup table output 760 from a digital signal to an analog signal 780. The filter 790 is capable of filtering the analog lookup table output 780 to generate the drive signal 630.

Figure 7B:
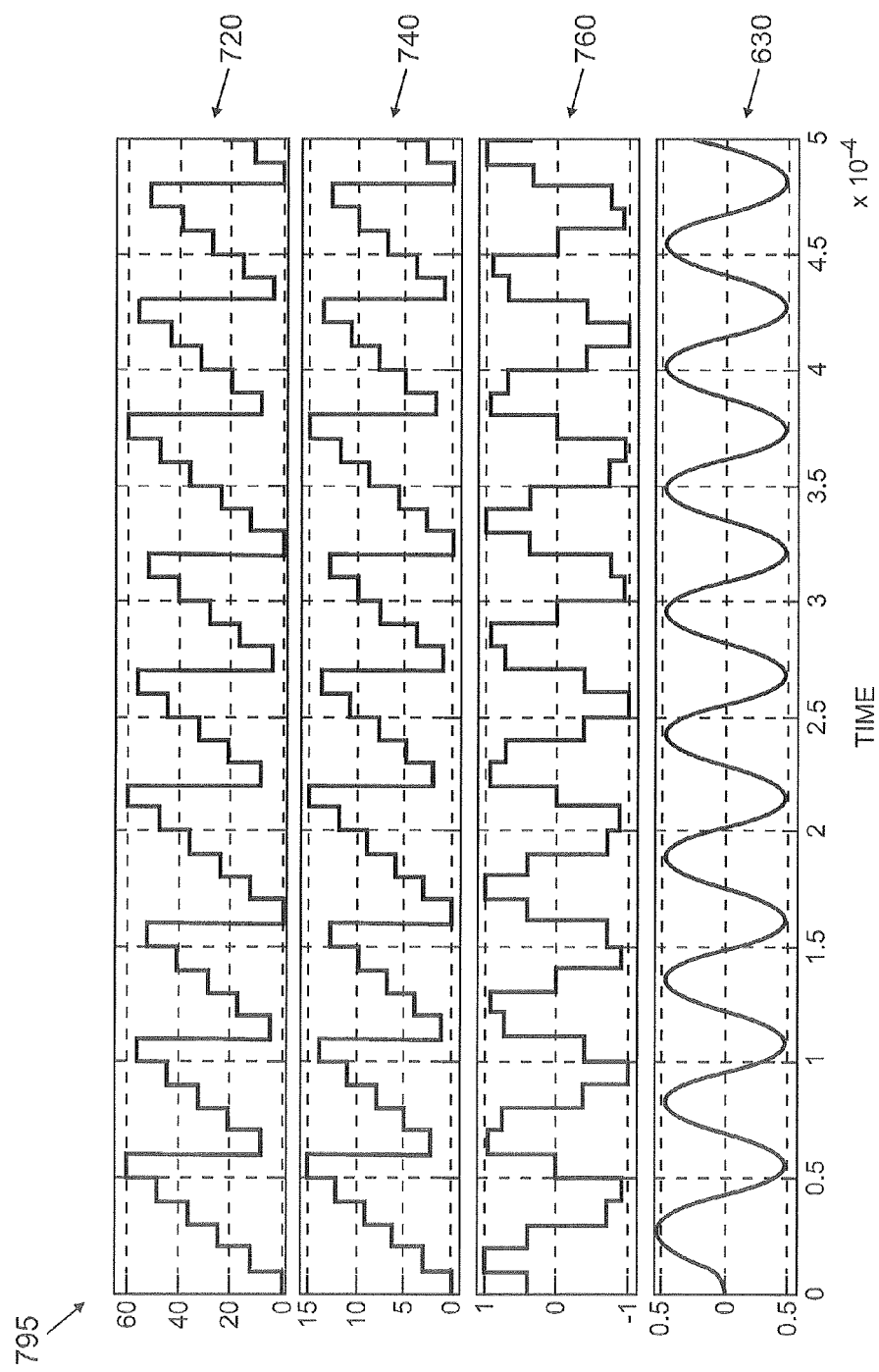
FIG. 7B is a timing diagram for the direct digital synthesis oscillator of FIG. 7A according to one embodiment of the present disclosure.

FIG. 7B is an example of a timing diagram 795 for the direct digital synthesis oscillator 625 according to one particular embodiment of the present disclosure. For this simplified example, which corresponds to the embodiment of the oscillator 625 illustrated in FIG. 7A, the summation 620 (or control word) is 12, the sample frequency is 100 kHz, and the phase accumulator 710 is a 6-bit accumulator. Thus, using the above equation, the operating frequency for this example is 18.750 kHz.

The timing diagram 795 comprises a phase accumulator waveform 720, an address waveform 740, a lookup table output 760, and a drive signal diagram 630. As illustrated in the phase accumulator waveform 720, the phase accumulator output increases by the control word value every clock cycle, while the frequency is set by the frequency of rollover of the phase accumulator 710.

As illustrated in the address waveform 740, the upper four bits of the phase accumulator output 720 are extracted by the address extractor 740 and used to address the lookup table 750. For this simplified example, the lookup table 750 is 16 locations long and has a magnitude resolution of three bits. Thus, the digital-to-analog converter 770 comprises a 3-bit converter.

As illustrated in the lookup table waveform 760, the lookup table 750 exhibits a phase jitter of ±1 clock cycle. This is characteristic of direct digital synthesis. Phase jitter may be greatly reduced with a post-DAC reconstruction filter 790. For example, the filter 790 may comprise a 20 kHz, two-pole filter. The filter 790 generates the drive signal 630 as illustrated in FIG. 7B. While the lookup table output 760 shown in FIG. 7B is barely recognizable as a sine wave, the filtered drive signal 630 shown in FIG. 7B is a credible sine wave with dramatically reduced phase jitter. For other embodiments, higher sample frequencies with larger lookup tables 750 yield very high quality sine wave outputs with insignificant phase jitter or other distortion.

Figure 8:
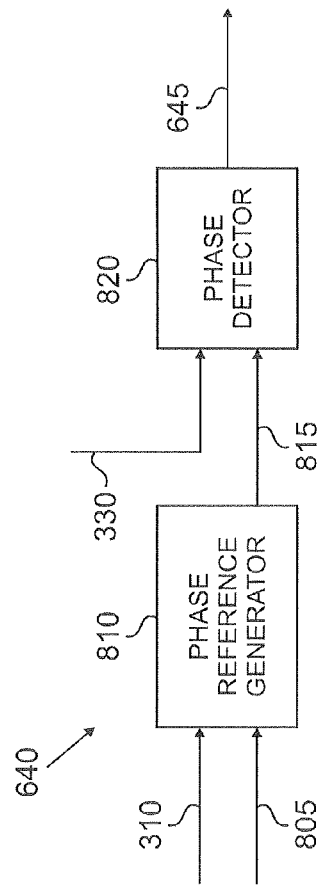
FIG. 8 is a block diagram of the phase comparator of FIG. 6 according to one embodiment of the present disclosure.

FIG. 8 is a block diagram of the phase comparator 640 according to one embodiment of the present disclosure. For this embodiment, the phase comparator 640 comprises a phase reference generator 810 and a phase detector 820. The phase reference generator 810 is capable of receiving the horizontal drive signal 310 and a phase lock signal 805 and generating a phase reference signal 815 based on those signals 310 and 805. The phase detector 820 is capable of receiving the horizontal sensor signal 330 and the phase reference signal 815 and generating the comparator output 645 based on those signals 330 and 815.

For one embodiment, the phase lock signal 805 may provide a predefined number of clock cycles to be used by the phase reference generator 810. The phase reference generator 810 is then capable of delaying the horizontal drive signal 310 from its rising edge by the predefined number of clock cycles. In this way, the phase reference generator 810 may generate a phase reference signal 815 that is delayed with respect to the horizontal drive signal 310 by a specified phase delay (e.g., 90°) that corresponds to the predefined number of clock cycles.

The phase detector 820 is then capable of comparing the phase reference signal 815 to the horizontal sensor signal 330 to determine whether the horizontal sensor signal 330 is delayed with respect to the horizontal drive signal 310 by the specified phase delay. In this way, with each horizontal cycle, the feedback provided via the horizontal sensor signal 330 may be checked to determine whether the signal 330 is leading or lagging the phase reference signal 815, which has the ideal phase desired for the horizontal sensor signal 330.

For a particular embodiment, if the horizontal sensor signal 330 is leading the phase reference signal 815, the frequency is too low and the phase detector 820 generates a +1 for the comparator output 645. Similarly, if the horizontal sensor signal 330 is lagging the phase reference signal 815, the frequency is too high and the phase detector 820 generates a −1 for the comparator output 645.

FIG. 9A is a block diagram of the phase error integrator 650 according to one embodiment of the present disclosure. For this embodiment, the phase error integrator 650 comprises a discrete time integrator 910 and a sample delay 915. The integrator 910 is capable of integrating the comparator output 645 from the phase comparator 640 over one vertical cycle.

For example, for a particular embodiment having three hundred horizontal cycles per vertical cycle, the horizontal rollover signal 632 causes the integrator 650 to sample the comparator output 645 three hundred times to generate an error signal 655 associated with one vertical cycle. Thus, the error signal 655 generated by the phase error integrator 650 has an output range that varies between −300 and +300.

The sample delay 915 is capable of receiving the vertical synchronization signal 325 and delaying it by one sample period. Once the error signal 655 corresponding to each vertical cycle has been provided to the sign block 660, the clear signal 920 clears the integrator 910. The polarity of the error signal 655 indicates whether, on average, the frequency was too high or too low during the vertical cycle period. This averaging effect is helpful in rejecting noise.

FIG. 9B is a timing diagram 925 for the phase error integrator 650 according to one embodiment of the present disclosure. For this example, four vertical cycles 940*a-d* are illustrated and three hundred horizontal cycles (not shown) are included during each vertical cycle. During the first vertical cycle 940*a*, the phase delay between the drive phase and the sensor phase was too low (e.g., less than 90°) for all of the horizontal cycles. Thus, the error signal 655 is the maximum of +300 and the frequency of the horizontal drive signal 310 is too low. Similarly, during the second vertical cycle 940*b*, the phase delay between the drive phase and the sensor phase was too low for most of the horizontal cycles. Thus, the error signal 655 is +200 and the frequency of the horizontal drive signal 310 is still too low.

During the third vertical cycle 940*c*, the phase delay between the drive phase and the sensor phase was too high (e.g., more than 90°) for most of the horizontal cycles. Thus, the error signal 655 is −175 and the frequency of the horizontal drive signal 310 is too high. Finally, during the fourth vertical cycle 940*d*, the phase delay between the drive phase and the sensor phase was too high for all of the horizontal cycles. Thus, the error signal 655 is the minimum of −300 and the frequency of the horizontal drive signal 310 is still too high. It will be understood that this example is for illustration only and that, based on the feedback provided through the accumulated correction signal 695, the error signal 655 may generally approach 0 with subsequent vertical cycles 940.

FIG. 10 is a block diagram illustrating the dither detector/gain block 670 according to one embodiment of the present disclosure. As described above, the drive signal generator 235 uses hysteretic control based on accumulated error correction of a discrete time accumulator (i.e., the phase correct accumulator 690). Because of this, the term "gain" refers to how much the accumulator 690 moves per step (either plus or minus) for every vertical cycle. Thus, the gain function of the dither detector/gain block 670 is optional. If omitted, the "gain" may be set to a size of one count per vertical cycle (i.e., the step for each vertical cycle may be +1 or −1), or to some other appropriate value which is a compromise between lock time and frequency dither.

However, for a particular example, a sample frequency of 20 MHz and a 32-bit phase accumulator 710 may be implemented. For this example, a single step would move the phase correct accumulator 690 by 4.7 mHz. Thus, if the resonant mode of the MEMS scanner 225 was 500 Hz away from the default setting of the drive signal generator 235, it would take over 100,000 vertical cycles (or almost 30 hours) to reach the desired frequency.

On the other hand, since the drive signal generator 235 functions as a hysteretic controller, a single ideal frequency is not identified. Instead, the drive signal generator 235 continues to dither back and forth across the ideal frequency. Thus, once the ideal frequency is identified, it is desirable to reduce the step size in order to minimize the frequency shift with each vertical cycle. Therefore, for one embodiment, the dither detector/gain block 670 may implement a variable step size, starting at a relatively high value and then decreasing and reversing direction each time the loop crosses over the ideal frequency. In this way, an approach similar to successive approximation is implemented.

For the particular embodiment illustrated in the simplified block diagram of FIG. 10, the dither detector/gain block 670 is implemented with a D latch 1020, an exclusive OR gate 1040, an AND gate 1050, and a 15-bit shift register 1070. Inputs to the block 670 are the integrated phase error signal 655 and the vertical synchronization signal 325. The output of the block 670 is the gain signal 675. Dither detection is achieved with the D latch 1020, the exclusive OR gate 1040, and the AND gate 1050. Gain setting is achieved with the shift register 1070.

The D latch 1020 has a data input 1010, which is the sign bit of the error signal 655, and a clock input, which is the vertical synchronization signal 325. Every rising edge of the signal 325, the data input 1010 is shifted into the Q output 1030 of the D latch 1020. At the rising edge of the signal 325, if the latch output 1030 and the data input 1010 are different logic states, the exclusive OR gate 1040 will supply logic one output 1045 to one input of the AND gate 1050. In this case, the signal 325 on the other input to the AND gate 1050 will cause a rising edge at the AND gate output 1060, providing a dither signal 1060 to the clock input of the shift register 1070. This simplified logic explanation is meant to convey the sense of operation without covering specific details about preventing race conditions, timing conflicts, initialization, etc.

The shift register 1070 may be preloaded with a gain 675 that is a high order bit set and will be right-shifted each time a dither signal 1060 occurs, thereby decreasing the gain 675 by a factor of two with each dither.

For a particular embodiment, the gain 675 may be initialized to be $2^{14}$. With each dither detection, as indicated by a rising edge of the dither signal 1060, the contents of the register 1070 may be shifted to divide the gain 675 by two until the value of the gain 675 reaches $2^3$. At this point, a count-not input 1080 changes from a 0 to a 1, inhibiting further dither signals 1060 from changing the value. Thus, for this embodiment, after reaching $2^3$, the gain 675 is no longer shifted in the register 1070 and remains $2^3$ until the shift register 1070 is reinitialized for another frequency search.

For this embodiment (having an initial, maximum gain 675 of $2^{14}$) and continuing with the above example, an initial gain of about 11 Hz per step allows the ideal frequency to be identified typically in less than one second. Once the ideal frequency is identified, using a final, minimum gain 675 of $2^3$ reduces the step size to about 37.3 mHz. The minimum step size could be further reduced, but leaving the step size slightly higher facilitates tracking associated with temperature drift.

Figure 11A:
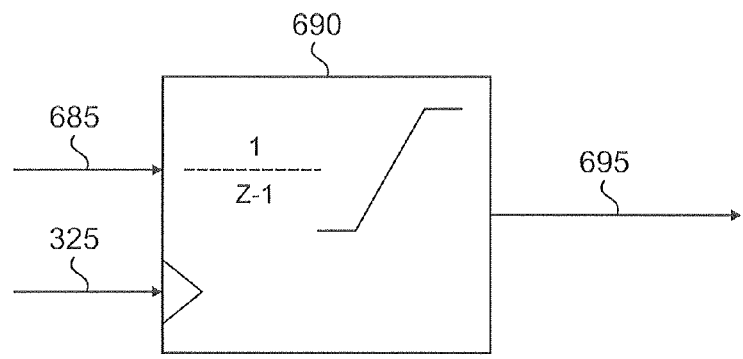
FIG. 11A is a block diagram of the phase correct accumulator of FIG. 6 according to one embodiment of the present disclosure.

FIG. 11A is a block diagram of the phase correct accumulator 690 according to one embodiment of the present disclosure. As described above, the phase correct accumulator 690 is capable of accumulating corrections provided through the signed gain 685 in order to bring the drive signal generator 235 to the correct frequency. For this embodiment, the phase correct accumulator 690 is not cleared but the signed gain 685 is added to the accumulated correction signal 695 at the rising edge of the vertical synchronization signal 325, which indicates the beginning of the vertical retrace. In this way, visual artifacts associated with changing the frequency are avoided.

For one embodiment, the range of the phase correct accumulator 690 may be limited to eliminate the possibility of operating on adjacent MEMS resonant modes. For example, if a malfunction occurs, the accumulated correction signal 695 may be limited so as not to exceed a predefined maximum value or to fall below a predefined minimum value.

Figure 11B:
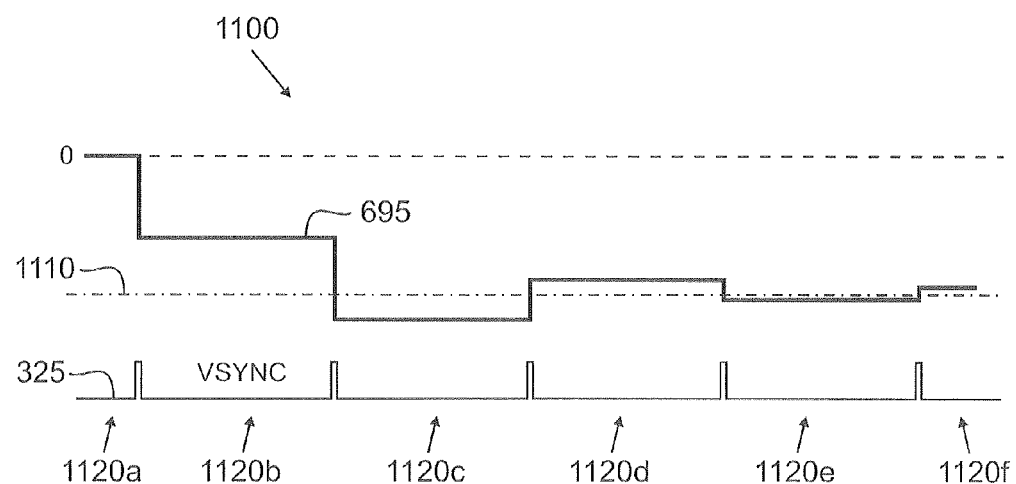
FIG. 11B is a timing diagram for the phase correct accumulator of FIG. 11A according to one embodiment of the present disclosure.

FIG. 11B is a timing diagram 1100 for the phase correct accumulator 690 according to one embodiment of the present disclosure. For this example, six vertical cycles 1120a-f are illustrated for the accumulated correction signal 695, the vertical synchronization signal 325, and the ideal accumulated correction 1110 associated with the horizontal resonant frequency.

The timing diagram 1100 illustrates an example of how decreasing the size of the gain 675 helps the drive signal generator 235 to identify the ideal correction signal 1110 relatively quickly. Because the accumulated correction signal 695 generated by the phase correct accumulator 690 is added to the initial control word 610, the sign of the gain 675 is important.

In the timing diagram 1100, the ideal correction 1110 for the horizontal resonant frequency is lower than the initial control word 610. Thus, after the first vertical cycle 1120a, the correction in the second vertical cycle 1120b is negative. Similarly, the correction in the third vertical cycle 1120c is negative. The correction in the fourth vertical cycle 1120d is positive because the change from the third vertical cycle 1120c overshot the ideal value 1110. The correction in the fifth vertical cycle 1120e is negative because the change from the fourth vertical cycle 1120d overshot the ideal value 1110. The correction in the sixth vertical cycle 1120f is positive because the change from the fifth vertical cycle 1120e overshot the ideal value 1110.

Starting with cycle 1120c of FIG. 11B, the value is approaching closer and closer to its ideal value 1110, because each time there is a correction from overshoot, the gain signal 675 is divided by 2. This pattern continues until the minimum gain value 675 is reached, at which time the correction alternates between positive and negative as the horizontal drive signal 310 generated by the drive signal generator 235 dithers back and forth around the ideal frequency associated with correction value 1110 (FIG. 11B) at the accumulated correction signal 695.

For a particular example, the sample frequency is 20 MHz, the number of phase accumulator bits is 32, the initial control word 610 is 3865471 (for a nominal horizontal resonant frequency of 18 kHz), and the actual horizontal resonant frequency associated with correction 1110 is 17.562 kHz. In addition, as described above, the minimum step size is $2^3$. For this particular example, the ideal correction $C_{Ideal}$ (i.e., signed gain 685) is as follows:

$$C_{ideal} = \frac{(17{,}562 - 18{,}000) \times 2^{32}}{20{,}000{,}000} = -94{,}060.$$

However, the actual correction generated by the multiplier 680 is −94,056 or −94,064. The ideal correction is unavailable because the step size is limited to a minimum of $2^3$. Therefore, in this example, the horizontal drive signal 310 would move back and forth between 17,561.982 Hz and 17,562.020 Hz.

Figure 12:
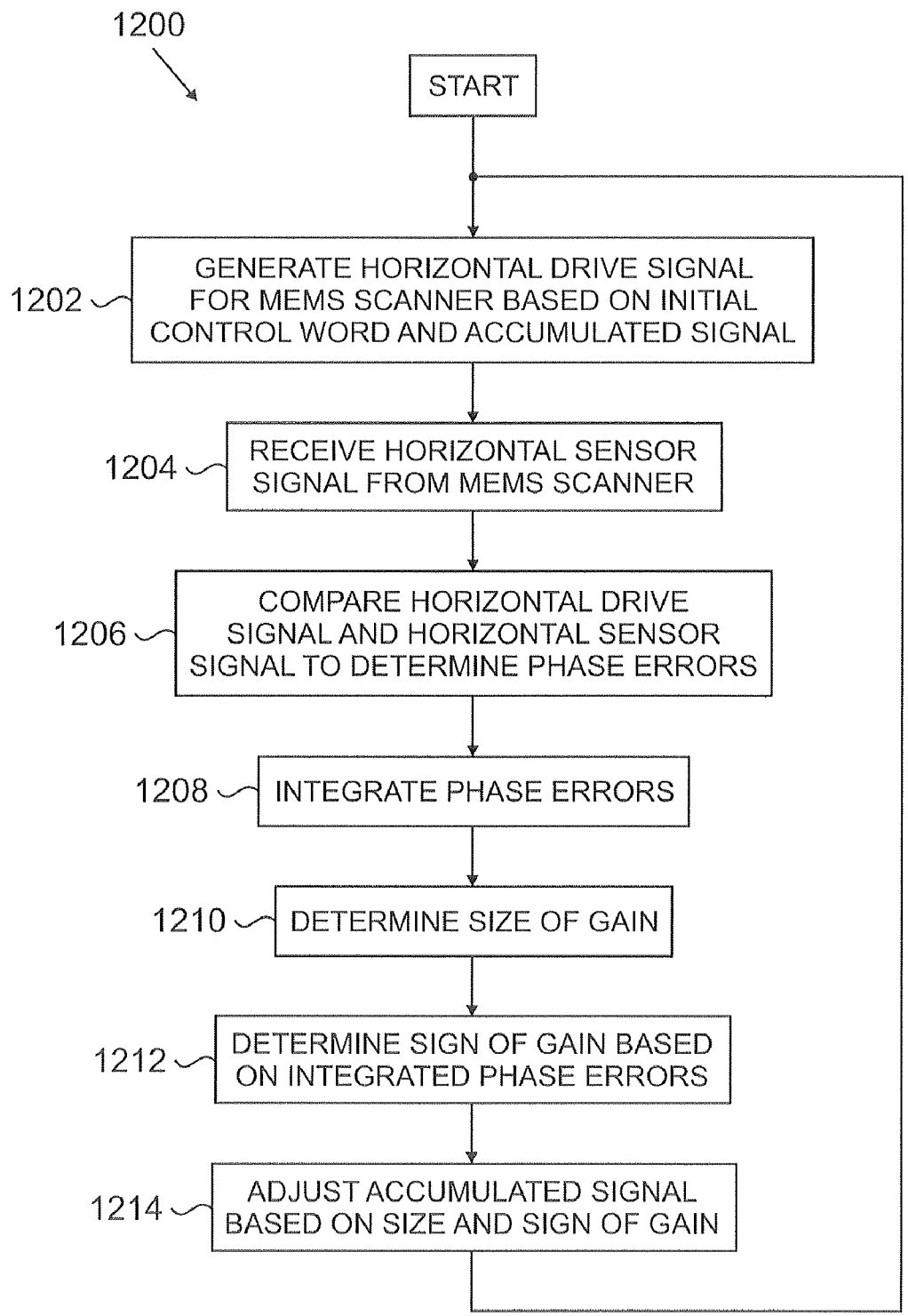
FIG. 12 is a flow diagram illustrating a method for operating the MEMS scanner of FIG. 2 on a resonant mode frequency according to one embodiment of the present disclosure.

FIG. 12 is a flow diagram illustrating a method 1200 for operating the MEMS scanner 225 on a resonant mode frequency according to one embodiment of the present disclosure. Initially, the direct digital synthesis oscillator 625, in conjunction with the amplifier 635, generates the horizontal drive signal 310 for the MEMS scanner 225 based on the initial control word 610 and the accumulated correction signal 695 (step 1202). For one embodiment, the direct digital synthesis oscillator 625 generates the drive signal 630 based on the summation 620 of the initial control word 610 and the accumulated correction signal 695, and the amplifier 635 amplifies the drive signal 630 to generate the horizontal drive signal 310. For a particular embodiment, the direct digital synthesis oscillator 625 may generate the drive signal 630 as described below in connection with FIG. 13.

The phase comparator 640 receives the horizontal sensor signal 330 from the MEMS scanner 225 (step 1204), as well as the horizontal drive signal 310, and compares the signals 310 and 330 to determine phase errors for each horizontal cycle (step 1206). For example, if the phase lag for a horizontal cycle is too low, the phase error may be +1 and, if the phase lag is too high, the phase error may be −1. The phase error integrator 650 integrates the phase errors from each of the horizontal cycles included in one vertical cycle to generate an error signal 655 (step 1208).

The dither detector/gain block 670 determines the size of the gain 675 (step 1210). For example, the dither detector/gain block 670 may begin with a larger gain 675 and decrease the gain 675 with each vertical cycle. For a particular example, the initial gain 675 may be a maximum of $2^{14}$, while each subsequent gain 675 may be determined by right-shifting the gain 675 until a minimum of $2^3$ is reached.

The sign block 660 determines the sign of the gain 675 based on the integrated phase errors (step 1212). For example, the sign block 660 may determine that the gain 675 should be positive when the error signal 655 is positive and that the gain 675 should be negative when the error signal 675 is negative.

The phase correct accumulator 690 adjusts the accumulated correction signal 695 based on the size of the gain 675 and the sign 665 (step 1214). For example, the phase correct accumulator 690 receives the signed gain 685 from the multiplier 680 and adds the signed gain 685 to the previous accumulated correction signal 695 to generate the adjusted accumulated correction signal 695. At this point, the direct digital synthesis oscillator 625, in conjunction with the amplifier 635, generates the horizontal drive signal 310 for the MEMS scanner 225 based on the initial control word 610 and the adjusted accumulated correction signal 695 (step 1202), and the method continues as before.

Figure 13:
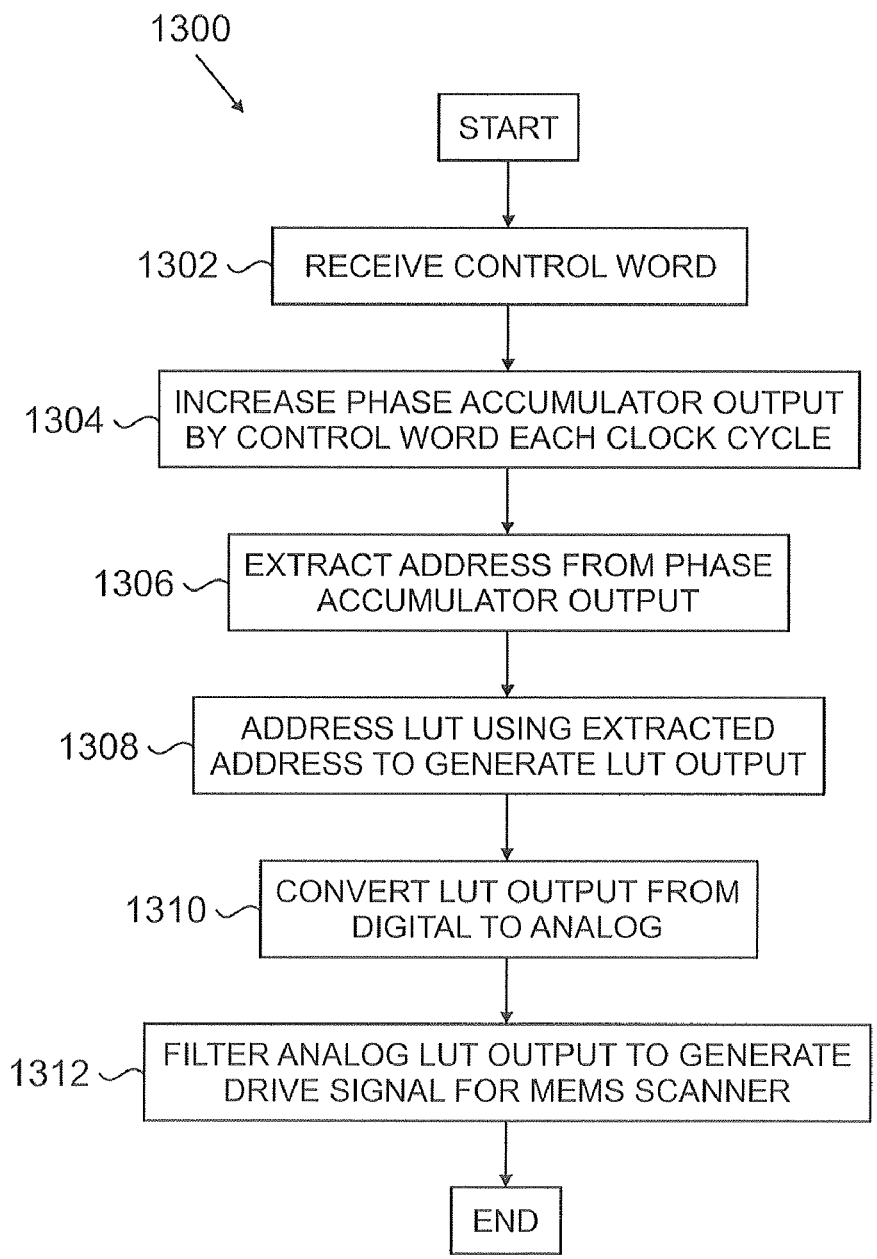
FIG. 13 is a flow diagram illustrating a method for generating a drive signal for the MEMS scanner of FIG. 2 according to one embodiment of the present disclosure.

FIG. 13 is a flow diagram illustrating a method 1300 for generating the drive signal 630, which may be amplified to generate the horizontal drive signal 310 for the MEMS scanner 225, according to one embodiment of the present disclosure. Initially, the phase accumulator 710 receives a control word (step 1302). For example, for one embodiment, the phase accumulator 710 receives the summation 620 of the initial control word 610 and the accumulated correction signal 695 as a control word.

The phase accumulator 710 increases the phase accumulator output 720 by the value of the control word (e.g., the summation 620) with each clock cycle (step 1304). The address extractor 730 extracts an address 740 from the phase accumulator output 720 (step 1306). For example, the address extractor 730 may extract the upper four bits of the phase accumulator output 720 to generate the address 740.

The address extractor 730 addresses the lookup table 750 using the extracted address 740 to generate the lookup table output 760 (step 1308). The digital-to-analog converter 770 converts the digital lookup table output 760 into an analog lookup table output 780 (step 1310). The filter 790 filters the analog lookup table output 780 to generate the drive signal 630 for the MEMS scanner 225 (step 1312). Following this, as subsequent control words are received with each vertical cycle (step 1302), the process is repeated.

It may be advantageous to set forth definitions of certain words and phrases used within this patent document. The term "couple" and its derivatives refer to any direct or indirect communication between two or more components, whether or not those components are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The term "each" means every one of at least a subset of the identified items. The phrases "associated with" and "associated therewith," as well as derivatives thereof, may mean: to include, to be included within, to interconnect with, to contain, to be contained within, to connect to or with, to couple to or with, to be communicable with, to cooperate with, to interleave, to juxtapose, to be proximate to, to be bound to or with, to have, to have a property of, or the like.

While this disclosure has described certain embodiments and generally associated methods, alterations and permutations of these embodiments and methods will be apparent to those skilled in the art. Accordingly, the above description of particular examples does not define or constrain this disclosure. Other changes, substitutions, and alterations are also possible without departing from the spirit and scope of this disclosure, as defined by the following claims.

What is claimed is:

1. A method for operating a micro-electro-mechanical system (MEMS) scanner on a resonant mode frequency, comprising:
generating a drive signal for the MEMS scanner based on an initial control word;
receiving a sensor signal associated with the MEMS scanner;
comparing the drive signal to the sensor signal;
generating an accumulated correction signal based on the comparison of the drive signal and the sensor signal; and
generating the drive signal for the MEMS scanner based on the initial control word and the accumulated correction signal;
wherein the drive signal is generated with a direct digital synthesis oscillator.

2. The method of claim 1, wherein comparing the drive signal to the sensor signal comprises:
generating a phase reference signal based on the drive signal and a phase lock signal; and
comparing the phase reference signal to the sensor signal.

3. The method of claim 1, wherein generating the accumulated correction signal comprises:
for each of a plurality of vertical cycles, integrating a phase error for each horizontal cycle to generate an error signal;
determining a sign for a gain based on the error signal; and
determining a current size for the gain based on the error signal and a previous size for the gain, wherein a signed gain comprises the determined current size and the determined sign.

4. A method for operating a micro-electro-mechanical system (MEMS) scanner on a resonant mode frequency, comprising:
generating a drive signal for the MEMS scanner based on an initial control word;
receiving a sensor signal associated with the MEMS scanner;
comparing the drive signal to the sensor signal;
generating an accumulated correction signal based on the comparison of the drive signal and the sensor signal; and
generating the drive signal for the MEMS scanner based on the initial control word and the accumulated correction signal;
wherein comparing the drive signal to the sensor signal comprises:
generating a phase reference signal based on the drive signal and a phase lock signal; and
comparing the phase reference signal to the sensor signal.

5. A method for operating a micro-electro-mechanical system (MEMS) scanner on a resonant mode frequency, comprising:
generating a drive signal for the MEMS scanner based on an initial control word;
receiving a sensor signal associated with the MEMS scanner;
comparing the drive signal to the sensor signal;
generating an accumulated correction signal based on the comparison of the drive signal and the sensor signal; and
generating the drive signal for the MEMS scanner based on the initial control word and the accumulated correction signal;
wherein generating the accumulated correction signal comprises:
for each of a plurality of vertical cycles, integrating a phase error for each horizontal cycle to generate an error signal;
determining a sign for a gain based on the error signal; and
determining a current size for the gain based on the error signal and a previous size for the gain, wherein a signed gain comprises the determined current size and the determined sign.

6. The method of claim 5, wherein generating the accumulated correction signal further comprises adding the signed gain to the accumulated correction signal.

7. The method of claim 6, further comprising summing the initial control word and the accumulated correction signal, wherein generating the drive signal based on the initial control word and the accumulated signal comprises generating the drive signal based on the summation.

8. A system comprising:
a drive signal generator operable to generate a drive signal; and
a micro-electro-mechanical system (MEMS) scanner operable to be driven by the drive signal and to generate a sensor signal, wherein the drive signal generator is further operable to receive the sensor signal and to generate the drive signal based on the sensor signal;
wherein the drive signal generator comprises a phase comparator operable to receive the drive signal and the sensor signal and to generate a comparator output based on the drive signal and the sensor signal; and
wherein the phase comparator comprises:
a phase reference generator operable to receive the drive signal and a phase lock signal and to generate a phase reference signal based on the drive signal and the phase lock signal; and
a phase detector operable to receive the phase reference signal and the sensor signal and to generate the comparator output based on a phase difference between the phase reference signal and the sensor signal.

9. The system of claim 8, wherein the phase reference generator is operable to generate the phase reference signal by delaying the drive signal by a specified number of clock cycles based on the phase lock signal.

10. The system of claim 8, wherein the phase detector is operable to generate a first value for the comparator output when the sensor signal leads the phase reference signal and a second value for the comparator output when the sensor signal lags the phase reference signal.

11. The system of claim 8, wherein the drive signal generator further comprises:
a phase error integrator operable to receive the comparator output and, for each of a plurality of vertical cycles, to integrate the comparator output for each horizontal cycle to generate an error signal.

12. A system comprising:
a drive signal generator operable to generate a drive signal; and
a micro-electro-mechanical system (MEMS) scanner operable to be driven by the drive signal and to generate a sensor signal, wherein the drive signal generator is further operable to receive the sensor signal and to generate the drive signal based on the sensor signal;
wherein the drive signal generator comprises:
a phase comparator operable to receive the drive signal and the sensor signal and to generate a comparator output based on a phase difference between the drive signal and the sensor signal; and
a phase error integrator operable to receive the comparator output and, for each of a plurality of vertical cycles, to integrate the comparator output for each horizontal cycle to generate an error signal.

13. The system of claim 12, wherein the drive signal generator further comprises a phase correct accumulator operable to add a signed gain to an accumulated correction signal, wherein the signed gain is determined based on the error signal, and wherein the drive signal generator is operable to generate the drive signal based on the accumulated correction signal.

14. The system of claim 13, wherein the drive signal generator further comprises:
a dither detector/gain block operable to determine a size for a gain based on the error signal;
a sign block operable to determine a sign for the gain based on the error signal; and
a multiplier operable to apply the sign to the size to generate the signed gain.

15. A system for operating a micro-electro-mechanical system (MEMS) scanner on a resonant mode frequency, comprising:
an initial control word block operable to provide an initial control word;
an adder operable to add the initial control word to an accumulated correction signal to generate a summation;
a direct digital synthesis oscillator operable to generate a drive signal based on the summation; and
an amplifier operable to generate a horizontal drive signal for the MEMS scanner based on the drive signal, wherein the accumulated correction signal is generated based on a phase difference between the horizontal drive signal and a horizontal sensor signal associated with the MEMS scanner.

16. The system of claim 15, further comprising a phase comparator operable to receive the horizontal drive signal and the horizontal sensor signal and to generate a comparator output based on the phase difference between the horizontal drive signal and the horizontal sensor signal.

17. The system of claim 16, wherein the phase comparator comprises:
a phase reference generator operable to receive the horizontal drive signal and a phase lock signal and to generate a phase reference signal based on the horizontal drive signal and the phase lock signal; and
a phase detector operable to receive the phase reference signal and the horizontal sensor signal and to generate the comparator output based on a phase difference between the phase reference signal and the horizontal sensor signal.

18. The system of claim 17, wherein the phase reference generator is operable to generate the phase reference signal by delaying the horizontal drive signal by a specified number of clock cycles based on the phase lock signal.

19. The system of claim 16, further comprising a phase error integrator operable to receive the comparator output and, for each of a plurality of vertical cycles, to integrate the comparator output for each horizontal cycle to generate an error signal.

20. The system of claim 19, further comprising a phase correct accumulator operable to generate the accumulated correction signal and to add a signed gain to the accumulated correction signal for each vertical cycle, and wherein the signed gain is determined based on the error signal.

21. The system of claim 20, further comprising:
a dither detector/gain block operable to determine a size for a gain based on the error signal;
a sign block operable to determine a sign for the gain based on the error signal; and
a multiplier operable to apply the sign to the size to generate the signed gain.

22. The system of claim 21, wherein the dither detector/gain block comprises a shift register operable to store the size for the gain and, for each vertical cycle, to right-shift the size for the gain until a minimum size for the gain is reached.

23. A system comprising:

a drive signal generator operable to generate a drive signal; and a micro-electro-mechanical system (MEMS) scanner operable to be driven by the drive signal and to generate a sensor signal;

wherein the drive signal generator comprises a phase-locked loop operable to receive the sensor signal and to adjust the drive signal generator to maintain a specified phase relationship between the drive signal and the sensor signal.

\* \* \* \* \*